United States Patent [19]
Pacher

[11] Patent Number: 5,853,298
[45] Date of Patent: Dec. 29, 1998

[54] INITIATOR CONNECTOR FOR AIRBAG SYSTEMS

[75] Inventor: Franz Pacher, Eckental, Germany

[73] Assignee: Framatome Connectors Interlock, Inc., Westland, Mich.

[21] Appl. No.: 821,721

[22] Filed: Mar. 20, 1997

[51] Int. Cl.⁶ .................................................. H01R 13/627
[52] U.S. Cl. ............................................................ 439/352
[58] Field of Search ...................................... 439/350, 352, 439/354, 357, 358, 347

[56] References Cited

U.S. PATENT DOCUMENTS

| | | | |
|---|---|---|---|
| 5,275,575 | 1/1994 | Cahaly et al. | 439/352 |
| 5,435,742 | 7/1995 | Cecil, Jr. | 439/347 |
| 5,529,521 | 6/1996 | Mlyniec | 439/352 |
| 5,591,041 | 1/1997 | Cecil et al. | 439/352 |
| 5,609,498 | 3/1997 | Muzslay | 439/352 |
| 5,616,045 | 4/1997 | Gauker | 439/352 |

FOREIGN PATENT DOCUMENTS

| | | |
|---|---|---|
| 0 591 947 A2 | 4/1994 | European Pat. Off. . |
| 43 17 344 A1 | 12/1994 | Germany . |

*Primary Examiner*—Hien Vu
*Attorney, Agent, or Firm*—Pollock, Vande Sande & Priddy

[57] ABSTRACT

An airbag igniter plug including a plug housing, a removable cover latched onto the housing, and a secondary locking clip having locking arms which are inserted into grooves in the cover and which are slidable from a rear unlocking position to a front locking position. A resilient finger on the locking clip cooperates with a ramp on the cover to retain the locking clip in its unlocking or locking position. When the locking clip is moved into its locking position, its locking arms bias the locking arms at the front of the plug body outwardly so as to engage their locking catches and prevent unmating of the plug from its mating socket.

6 Claims, 3 Drawing Sheets

INITIATOR CONNECTOR FOR AIRBAG SYSTEMS

BACKGROUND OF THE INVENTION

1. Field of the Invention

The present invention relates to electrical connectors with vehicle occupant inflatable restraint systems, generally known as airbag systems. More particularly, the invention relates to an airbag igniter plug with a cover and a locking clip inserted in the cover and slidable from a rear unlocking position to a front locking position.

2. Description of the Related Art

Use of airbag systems in motor vehicles has become virtually universal in recent years and is mandatory in many jurisdictions. Such systems normally include an airbag assembly mounted in a hidden compartment beneath the dashboard and an electrical or electronic control system for activating the assembly upon occurrence of a crash. The airbag assembly is generally connected to the control system by a wiring harness provided with a plug with socket contacts and a socket that receives pin contacts of the initiater.

A connector system of this type is shown, for example, in EP 0 591 947, in which the system is associated with an interlock including a locking element that is inserted into the connection to prevent separation of a pair of male connector elements carried by a first component from a pair of female connector elements carried by a second component and releasably mated therewith. A shorting element is associated with the first component and includes a pair of contact elements each biased into electrical contact with one of the pair of first connector elements for producing a short therebetween. The second component has a body comprising a portion contoured to enter between the pairs of connector elements for disconnecting the short upon mating of the first and second components, which are mechanically latched together. The locking element prevents release of the latch and hence separation of the two components while in the locked position.

U.S. Pat. No. 5,435,742 shows an electrical connector position assurance system (CPA) in which one of two mating connectors includes a projection which is at a first location when the connectors are fully mated and at a second location when they are less than fully mated. The projection blocks movement of a CPA from its first to its second position when the projection is in its second location. A latch holds the connectors in mated condition when the CPA is in its second position.

SUMMARY OF THE INVENTION

The invention comprises an airbag igniter plug including a housing, a removable cover which is latched onto the housing, and a secondary locking clip having secondary locking arms which are inserted into insertion grooves provided in the cover and extending from sliding grooves which permit the locking clip to slide longitudinally in a reception cavity in the cover, from a rear unlocking position to a front locking position. The locking clip comprises a resilient finger or latch arm which cooperates with a boss or ramp on the cover so as to assure that the locking clip is stably retained in the locking or unlocking position. Guide surfaces projecting from the arms of the locking clip prevent it from becoming disengaged from the cover.

In the rear unlocking position of the secondary locking clip, its secondary locking arms are positioned in grooves of the plug housing and are not in contact with the locking arms of the plug. In this position, the plug is hence free to be mated in an igniter socket, and to be unmated therefrom by pressing the ends of the plug locking arms, which may be configured as push buttons.

When the secondary locking plug is slid forwardly into its locking position, the secondary locking arms come into contact with the locking arms of the plug and prevent unmating of the plug and socket.

BRIEF DESCRIPTION OF THE DRAWINGS

In order that the invention may be more clearly understood, it will now be described with reference to the accompanying drawings, in which an embodiment of the invention is shown for purposes of illustration.

DESCRIPTION OF PREFERRED EMBODIMENT

Figure 1:
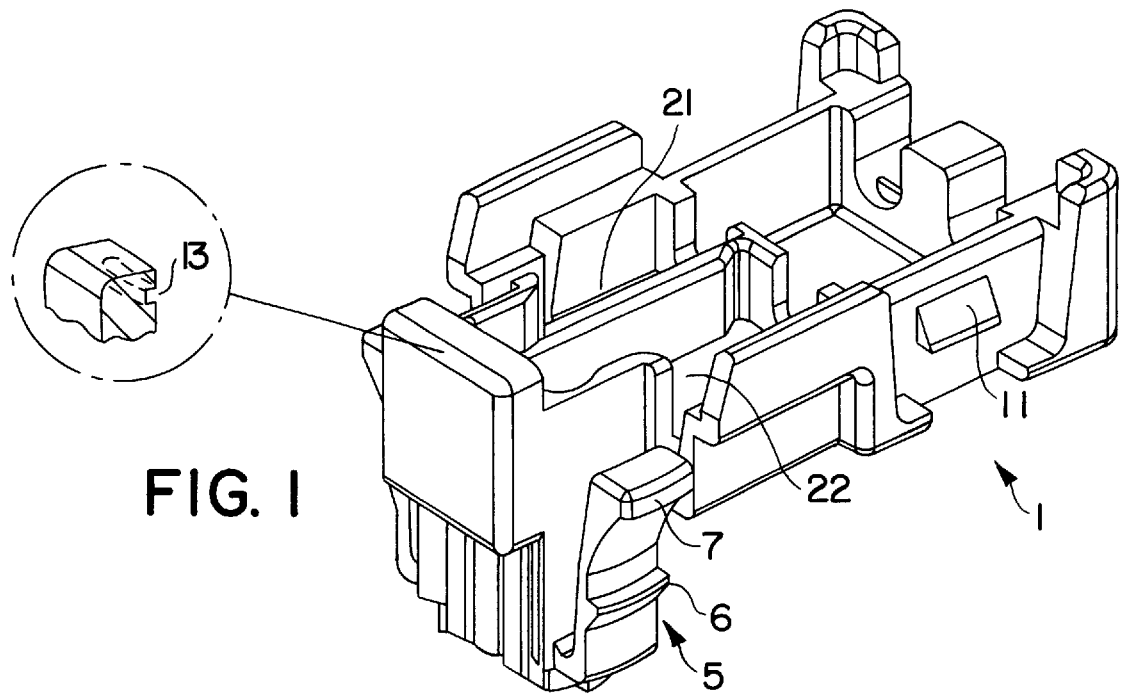
FIG. 1 is a perspective view of the plug housing.

As shown in FIG. 1, plug body 1 has a generally rectangular shape with longitudinally extending, parallel contact receiving chambers 21 and 22. Side latches 11 are provided on both sides of the plug, and a transversely extending latching arrangement 13 is provided at the front end of the plug. Plug locking arms 5 extend downwardly on both sides of the front end, and these comprise horizontally extending locking catches 6 and horizontally extending, outwardly projecting unlocking p buttons 7 at their upper edges.

Figure 2:
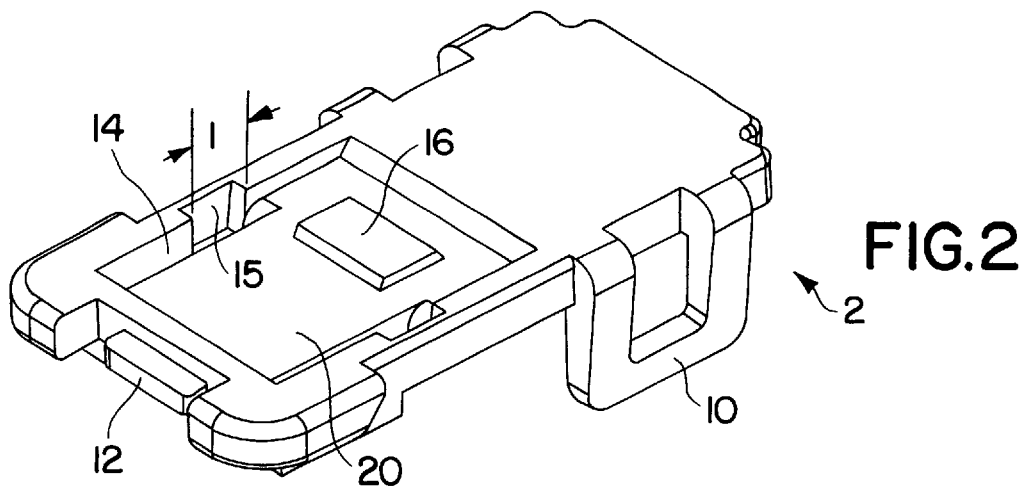
FIG. 2 is a perspective view of the plug cover.

As shown in FIG. 2, cover 2 has a generally rectangular shape corresponding to that of plug 1. Near the rear ends of its sides, it has downwardly extending loops 10 which engage side latches 11 of the plug body. At its front end, cover 2 has a transversely extending latch member 12 which latches underneath latching arrangement 13 of the plug body.

Figure 3:
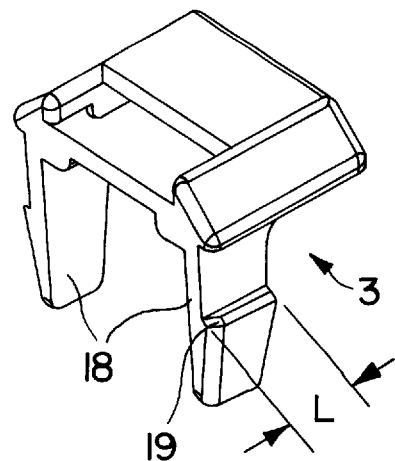
FIG. 3 is a perspective view of the secondary locking clip according to the invention.
Figure 4:
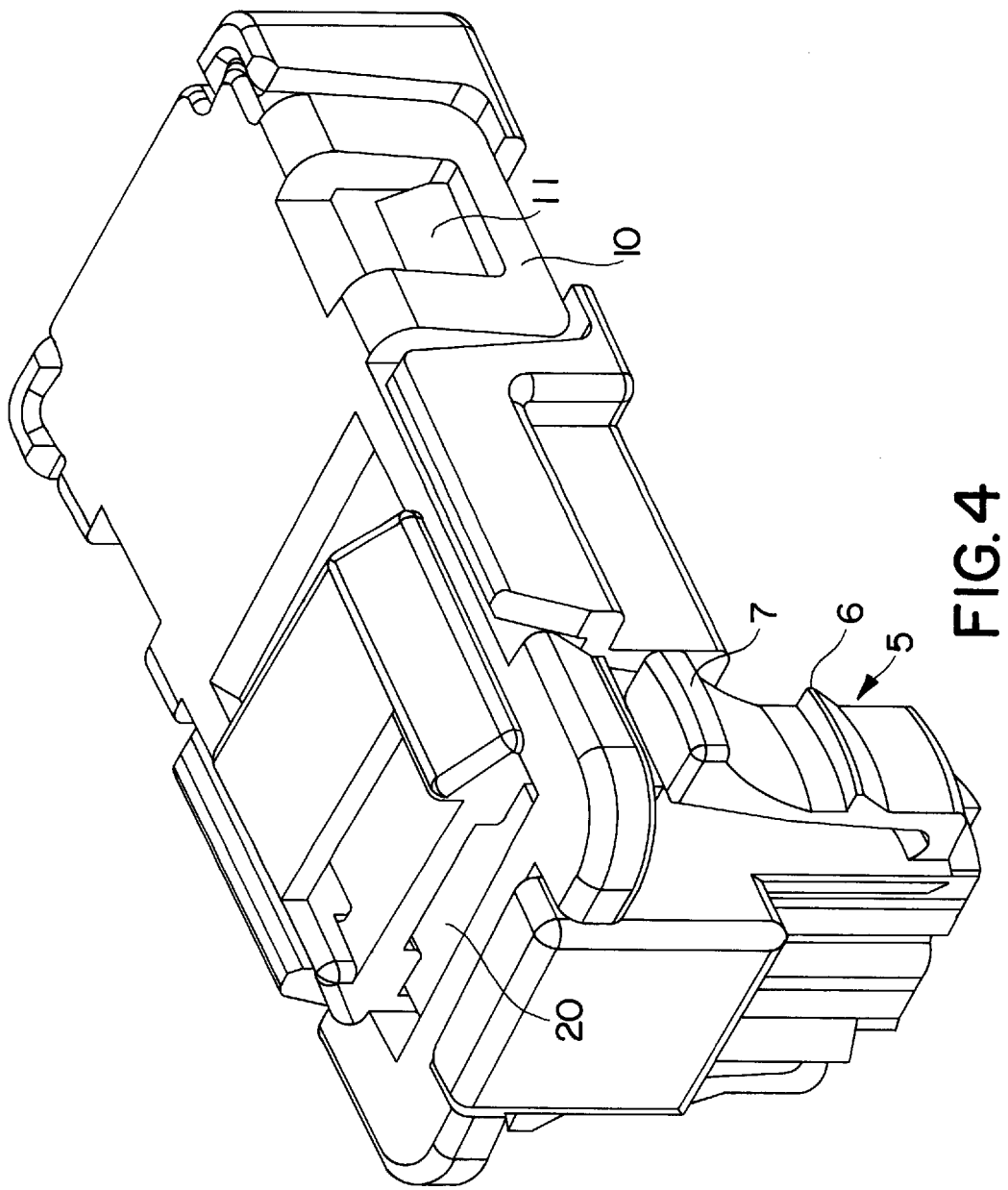
FIG. 4 is a perspective view of the housing, cover and secondary locking clip in assembled condition.
Figure 5:
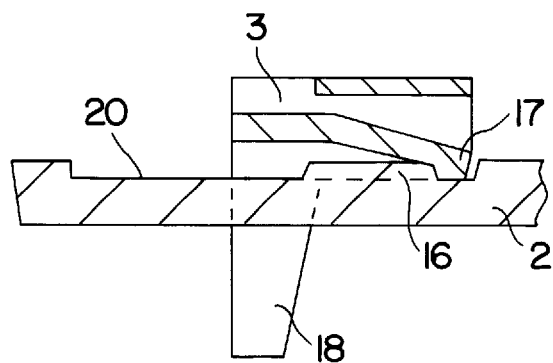
FIG. 5 is a detail section view showing the secondary locking clip in its rear unlocking position.
Figure 6:
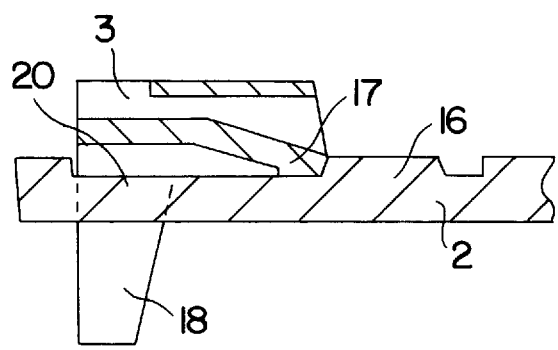
FIG. 6 is a detail section view showing the secondary locking clip in its front locking position.

As shown in FIG. 3, secondary locking clip 3 has two downwardly extending secondary locking arms 18 which are inserted downwardly into insertion grooves 15 in cover 2. These insertion grooves 15 are laterally widened portions of longitudinally extending sliding grooves 14 which permit front-to-rear sliding of secondary locking clip 3 along reception cavity or recess 20 in the upper surface of cover 2. The width L of secondary locking arms 18 is slightly greater than that of insertion grooves 15, to enable force-fitting of secondary locking clip 3. A resilient finger 17 provided on secondary locking clip 3 cooperates with a boss 16 on cover 2 to assure that the clip remains stable in either the locking or unlocking position, and guide rails 19, which engage underneath an overhang 23 of the lateral walls of grooves 14, prevent secondary locking clip 3 from exiting from cover 2.

In the rear unlocking position of secondary locking clip 3, arms 18 rest in grooves in the housing of plug 1 and do not engage locking arms 5 of plug 1. In this position, the plug can be mated with an igniter socket (not shown), and can be unmated therefrom by pushing in push buttons 7 projecting outwardly from the upper ends of locking arms 5.

Figure 7:
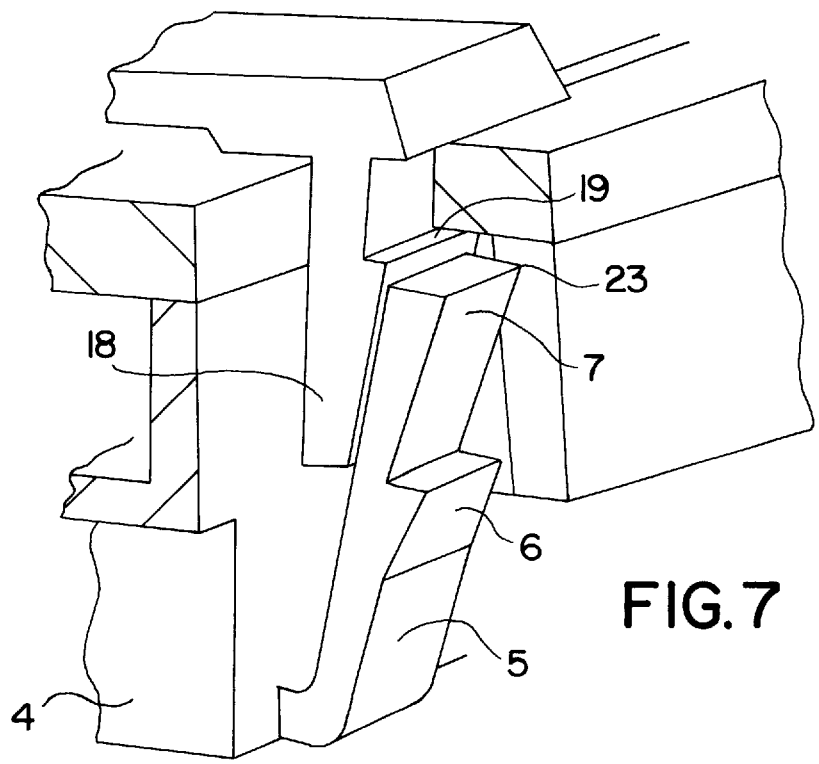
FIG. 7 is a perspective view showing the interaction of an arm of secondary locking clip 3 with locking arms 5 of the plug.

When locking is to be effected, secondary locking clip 3 is slid forwardly in grooves 14, bringing its arms 18 into engagement with locking arms 5 of plug 1 (FIG. 7), forcing them outwardly, and thereby preventing unmating of the plug from the socket.

What is claimed is:

1. A plug adapted to mate with a socket of an electrical connector assembly, said plug comprising:

(a) a plug housing (1) having a nose portion (4) with pivotable, upwardly extending lateral locking arms (5) adapted to lock said plug to a socket;

(b) a removable cover (2) for said housing;

(c) latching means (10–13) located on said housing and said cover for latching said cover to said housing;

(d) a secondary locking clip (3) having secondary locking arms (18) adapted to be inserted downwardly into insertion grooves (15) in said cover (2) and to slide along an upper surface of said cover in longitudinally extending sliding grooves (14) in said cover, from a rear unlocking position to a front locking position;

(e) said secondary locking arms (18) extending through said cover, said secondary locking arms each having an outwardly extending projection which, in said front locking position of said secondary locking clip (3), engages an interior surface of a said lateral locking arm (5) and forces said lateral locking arm outwardly to prevent disconnection of said plug from a said socket.

2. A plug according to claim 1, wherein said secondary locking clip comprises a resilient finger (17) which cooperates with a boss on said cover (2) to assure that said secondary locking clip (3) is retained in said rear unlocking position and said front locking position, respectively.

3. A plug according to claim 1, wherein said latching means (10–13) comprise loops (10) extending downwardly on both longitudinal sides of said cover (2) and engaging latches (11) projecting from both longitudinal sides of said plug housing (1), as well as a latch member (12) extending transversely at a front end of said cover (2) and latching underneath a transverse latching portion (13) of a front end of said plug housing (1).

4. A plug according to claim 1, wherein said insertion grooves (15) are widened portions of said sliding grooves (14), and guide rails (19) projecting outwardly from said secondary locking arms (18) engage underneath an overhang (23) of lateral walls of said sliding grooves (14) to prevent disengagement of said secondary locking clip (3) from said cover (2).

5. A plug according to claim 1, wherein said lateral locking arms (5) are pivotably disposed on both sides of said nose portion of said plug housing (1) and each comprise a horizontally extending locking catch (6) and an outwardly projecting unlocking push button (7) for disengaging said locking catch (6) from a locking position when said secondary locking clip (3) is in rear unlocking position.

6. A plug according to claim 4, wherein said secondary locking arms (18) have a width (L) slightly greater than a width (1) of said insertion grooves (15) to enable said secondary locking arms to be force-fitted into said insertion grooves.

* * * * *